United States Patent [19]  
Miyata et al.

[11] Patent Number: 4,534,057  
[45] Date of Patent: Aug. 6, 1985

[54] FREQUENCY RESPONSE DISPLAY FOR USE WITH A GRAPHIC EQUALIZER

[75] Inventors: Toshihiko Miyata, Yokohama; Takashi Shibata, Kamakura, both of Japan

[73] Assignee: Sony Corporation, Tokyo, Japan

[21] Appl. No.: 452,613

[22] Filed: Dec. 23, 1982

[30] Foreign Application Priority Data

Dec. 24, 1981 [JP] Japan ............................ 56-196372[U]

[51] Int. Cl.³ .............................................. G01R 23/17
[52] U.S. Cl. ..................................... 381/58; 340/815.11
[58] Field of Search ................... 381/56, 58, 101, 102, 381/103; 340/815.11, 815.17; 455/159; 73/645, 646, 647, 648

[56] References Cited

U.S. PATENT DOCUMENTS

| | | | |
|---|---|---|---|
| 3,849,769 | 11/1974 | Chiba | 340/815.17 |
| 3,924,231 | 12/1975 | McClure | 340/815.11 |
| 4,118,601 | 10/1978 | Yeap | 381/56 X |
| 4,307,340 | 12/1981 | Inami et al. | 381/58 |
| 4,345,247 | 8/1982 | Thornton et al. | 381/58 X |
| 4,359,601 | 11/1982 | England | 381/58 X |
| 4,405,836 | 9/1983 | Meyerhoff | 381/103 |

FOREIGN PATENT DOCUMENTS

| | | | |
|---|---|---|---|
| 56-36210 | 4/1981 | Japan | 381/103 |
| 58-24210 | 2/1983 | Japan | 381/103 |

Primary Examiner—Keith E. George  
Attorney, Agent, or Firm—Hill, Van Santen, Steadman & Simpson

[57] ABSTRACT

An indicator and display for use with a graphic equalizer which receives an audio signal and includes first and second band pass filters which receive the audio signal and pass different pass bands, first and second variable resistors which have control shafts and knobs connected thereto with illuminators mounted in the knobs, first and second rectifiers connected to the output of the band pass filters, and first and second drive circuits connected to the outputs of the first and second rectifiers and the drive circuits connected to the illuminators in the knobs and an oscillator switching circuit connected to the illuminators so as to cause the illuminators to flash under certain conditions.

7 Claims, 4 Drawing Figures

FREQUENCY RESPONSE DISPLAY FOR USE WITH A GRAPHIC EQUALIZER

BACKGROUND OF THE INVENTION

1. Field of the Invention

The present invention relates in general to a frequency response display for a graphic equalizer and particularly is directed to a frequency response display wherein the frequency characteristics of incoming signals cause illumination means mounted in the knobs used to set the amplitudes of the various pass bands to indicate when the signals in the pass band exceed a preset limit.

2. Description of the Prior Art

Slide volume controls and variable resistors with control knobs mounted on the front panel have been used with graphic equalizers. For example, if there are four knobs for the slide volume controls, the respective knobs allow the adjustment of the gains of the particular frequency band controlled by the knob in the graphic equalizer. Each of the knobs controls a pass band with a center frequency and by moving the knobs of the slide volume controls the output frequency characteristic can be varied. Thus, by adjusting the positions of the respective knobs, the output signals can be controlled.

With such prior art graphic equalizers by noting the position of the control knobs can be observed how the various signals are adjusted, but the amplitude of the signals cannot be determined.

Also, in the prior art, a graphic equalizer which uses light emitting elements in the knobs of the slide volume controls are known. In such prior art devices, the light emission elements are merely continuously lighted when the equipment is turned on and such lights do not indicate the frequency characteristics or the amplitude of the signals in the graphic equalizer and the level of the signal cannot be determined from a remote position.

Thus, in prior art graphic equalizers, the frequency characteristics of the signals from amplifiers which are connected to the graphic equalizers cannot be correctly determined from a remote location.

SUMMARY OF THE INVENTION

It is an object of the present invention to provide a frequency response display device for use with a graphic equalizer which is an improvement over prior art graphic equalizers.

Another object of the invention is to provide a frequency response display for use with the graphic equalizer in which the frequency characteristics of the signals from the amplifiers which are connected to the graphic equalizer can be accurately and clearly determined by the positions of the knobs which are provided in the graphic equalizer.

According to an aspect of the present invention, there is provided a frequency response display for use with the graphic equalizer which comprises: an input terminal supplied with an audio signal to be displayed, a first band pass filter means is connected to the input terminal and passes the portion of an audio signal within a first frequency range, means for adjusting the output of the first band pass filter and a first rectifier rectifying the output of the first band pass filter, second band pass filter means connected to the input terminal and passing the portion of the audio signal within a second frequency range, means for adjusting the amplitude of the output of the second band pass filter means and a second rectifier rectifying the output signal from the second band pass filter means, a first drive circuit connected to the output of the first rectifier and driving a first display device when the output of the first rectifier exceeds a predetermined value, a second drive circuit connected to the second rectifier and driving a second display device when the output of the second rectifier exceeds a predetermined value and switching means connected to the first and second drive means for alternately operating the first and second display devices.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
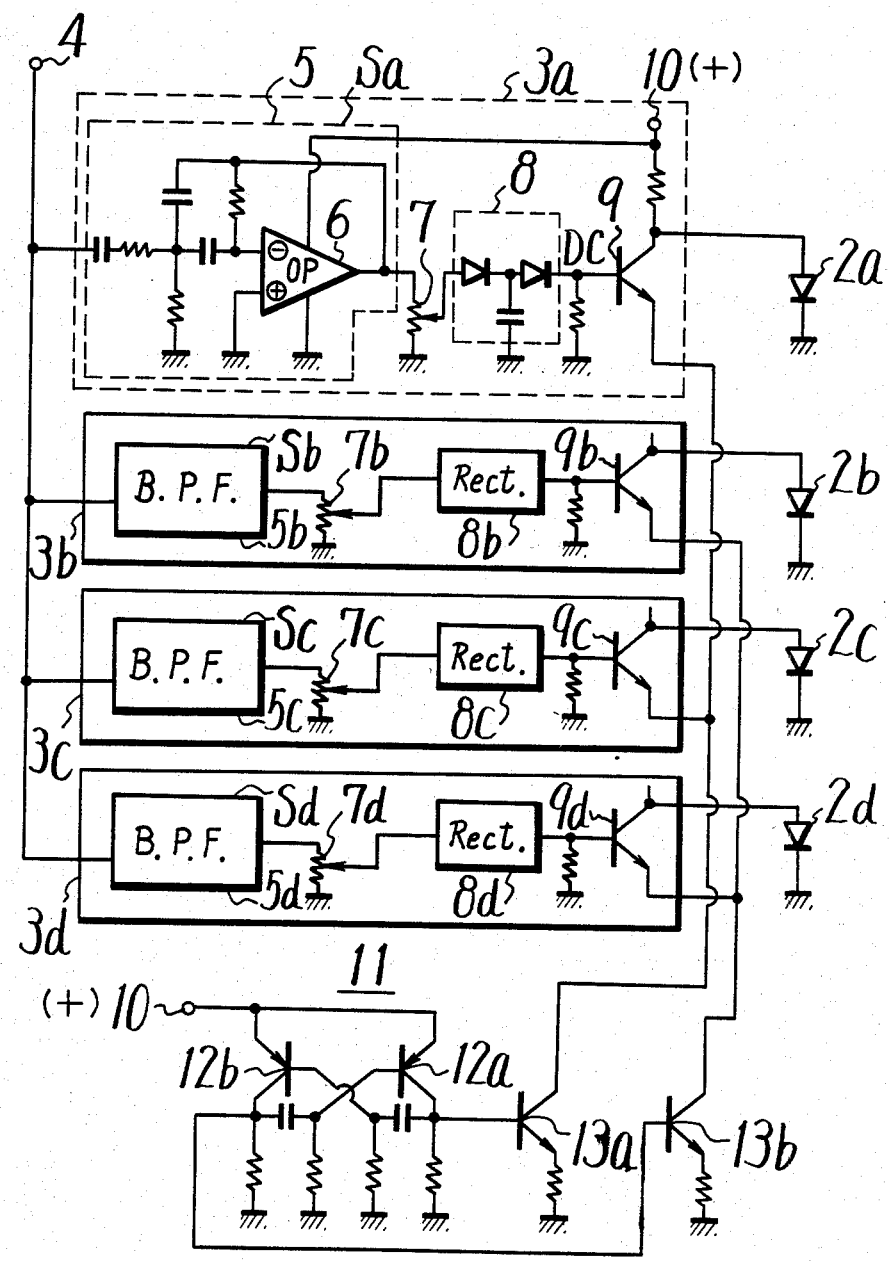
FIG. 1 is an electrical schematic diagram illustrating a first embodiment of the frequency response display for use with a graphic equalizer of the invention.
Figure 3:
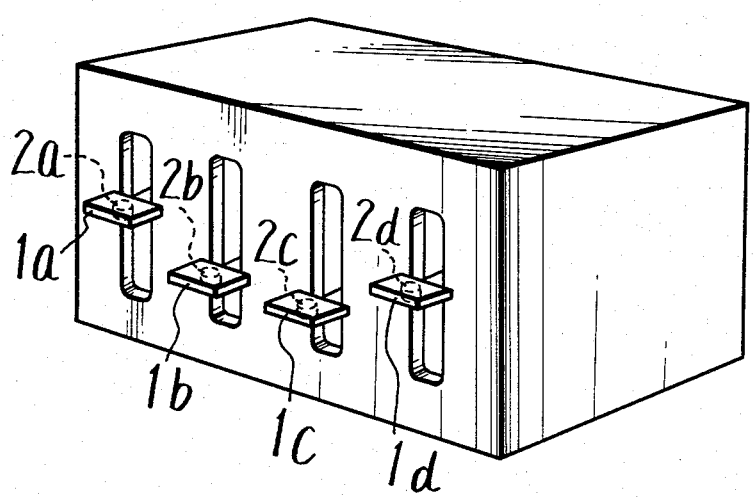
FIG. 3 is a perspective view illustrating a graphic equalizer in which the frequency response display of the invention is utilized.
Figure 4:
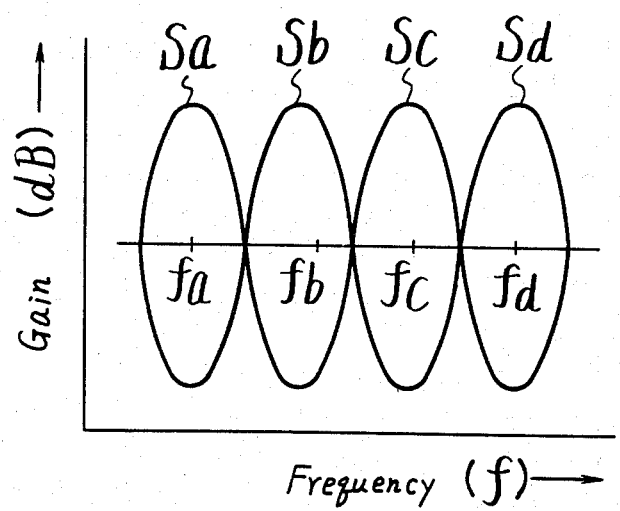
FIG. 4 is a graph showing the characteristic curves of the graphic equalizer in which the frequency response display of the invention is utilized.

FIG. 1 illustrates a frequency response display for use with a graphic equalizer according to the invention and includes an input terminal 4 to which the audible frequency signals which are obtained at the output terminal of the well known graphic equalizer are applied. The audible signals may extend over the range from 30 to 20,000 cycles, for example and the input terminal is connected to a plurality of control circuits 3a, 3b, 3c and 3d for controlling light emitting elements 2a, 2b, 2c and 2d. As illustrated in FIG. 3, a graphic equalizer which is contained in the case is shown and has a plurality of control knobs 1a, 1b, 1c and 1d in which are mounted light emitting elements 2a, 2b, 2c and 2d respectively. The knobs 1a, 1b, 1c and 1d are connected to shafts for adjusting the gains of variable impedances which are associated with the signals having frequency responses of Sa, Sb, Sc and Sd illustrated in FIG. 4. The signals have center frequencies fa, fb, fc and fd as illustrated in FIG. 4. In a specific example, Sa might extend from 30 to 200 cycles, Sb might extend from 200 to 800 cycles, Sc might extend from 800 to 3000 cycles, and Sd might extend from 3000 to 20,000 cycles.

Thus, by adjusting the position of the knobs 1a through 1d, the amplitudes of the signals in the different pass bands can be adjusted.

It should be realized, of course, that in some equipment a number much larger than 4 volume controls are utilized and four knobs are used just merely by way of example.

As illustrated in FIG. 1, the control circuits 3a, 3b, 3c and 3d have different pass bands and all are similar except that the band pass filters in each one allows different frequencies to pass.

Control circuit 3a, for example, has a band pass filter 5 which is connected to the input terminal 4 and it passes a frequency band of Sa, for example, and comprises various resistors and capacitors connected as shown and an operational amplifier 6. The output of the operational amplifier 6 is supplied to a variable resistor or volume control 7 which has its other side connected to ground and which has a slide contact which is controlled by a shaft so as to adjust the amplitude of the signal on the slide contact. A rectifier circuit 8 receives the output of the slide contact of the variable resistor 7 and converts it to DC. A switching transistor 9 has its base connected to the output of the rectifier circuit 8 and has its collect or connected to ground through the light emitting element 2a.

In control circuit 3a, the signal Sa having predetermined frequency band illustrated in FIG. 4 and a center frequency of fa is extracted by the band pass filter 5 from the signals applied to input terminal 4 and is then fed to the rectifier circuit which produces a DC output signal. If the variable resistor 7 is not varied or adjusted, the DC output from the rectifier 8 will be substantially proportional to the output from the band pass filter 5. If the variable resistor 7 is adjusted or varied, the output voltage from the band pass filter 5 that will cause the transistor 9 to be turned on can be set by varying the slide contact of the resistor 7. A power supply in the illustrated example which is a plus voltage is applied to power supply terminal 10.

The band pass filter 5b in control circuit 3b passes the signal Sb which has a center frequency of fb as illustrated in FIG. 4. The band pass filter 5c in control circuit 3c passes the signals Sc as illustrated in FIG. 4. The control circuit 3d has a band pass filter 5d which passes the signal Sd illustrated in FIG. 4.

As shown in FIG. 1, a reference signal oscillator 11 produces an output pulse signal with a predetermined period. The reference signal oscillator may be designed to produce a pulse signal with a frequency of 6 to 8 Hz and may be an as table multivibrator and is formed primarily of transistors 12a and 12b. The outputs from the transistors 12a and 12b are respectively fed to switching transistors 13a and 13b.

The emitters of every other switching transistors 9 of the circuits 3a, 3b, 3c and 3d for the light emitting elements 2a, 2b, 2c and 2d are connected together and are respectively connected to the collectors of the transistors 13a and 13b.

In other words, the emitters of transistors 9, 9c are connected together and to the collector of the transistor 13a. The emitters of transistors 9b and 9d are connected together and to the collector of transistor 13b. The emitters of transistors 13a and 13b are connected to ground through bias resistors as shown.

When power is applied to power terminal 10, the reference oscillator 11 always oscillates and the collectors of the transistors 12a and 12b are alternately made high and low level. Thus, when transistor 13a is on, transistor 13b will be off and when transistor 13b is on transistor 13a will be off.

In operation, let it be assumed that the signals applied to input terminal 4 are the signals Sa, Sb, Sc and Sd in the audible range from the graphic equalizer and which are adjusted in gain. In the control circuit 3a, the signal Sa with a center frequency fa illustrated in FIG. 4 is extracted by the band pass filter 5 and when the signal components Sa is small, the output from rectifier 8 will also be small. Thus, the transistor 9 will remain in the off state and the light emitting element 2a will be constantly lighted from the power supply 10 which flows through the light emitting element 2a to ground.

When the signal Sa with a center frequency of fa is increased to make it larger by operating the knob 1a of the graphic equalizer proper, the transistor 9 of the control circuit 3a will be turned on. The transistor 13a is alternately turned on and off by the reference oscillator 11 and the light emitting element 2a will be alternately turned on and off by the switching action of the transistors 13a and 9.

The same circuits illustrated in FIG. 1 will cause the light emitting elements 2b, 2c and 2d to be controlled in the same manner.

When all of the transistors 9, 9b, 9c and 9d in all of the control circuits 3a, 3b, 3c and 3d turn on, all of the light emitting elements 2a, 2b, 2c and 2d will flash on and off. However, since the alternate light emitting elements 2a and 2c are connected to transistor 13a and the light emitting elements 2b and 2d are connected to the transistor 13b they will be alternately lighted since the transistors 13a 13b alternately conduct.

Figure 2:
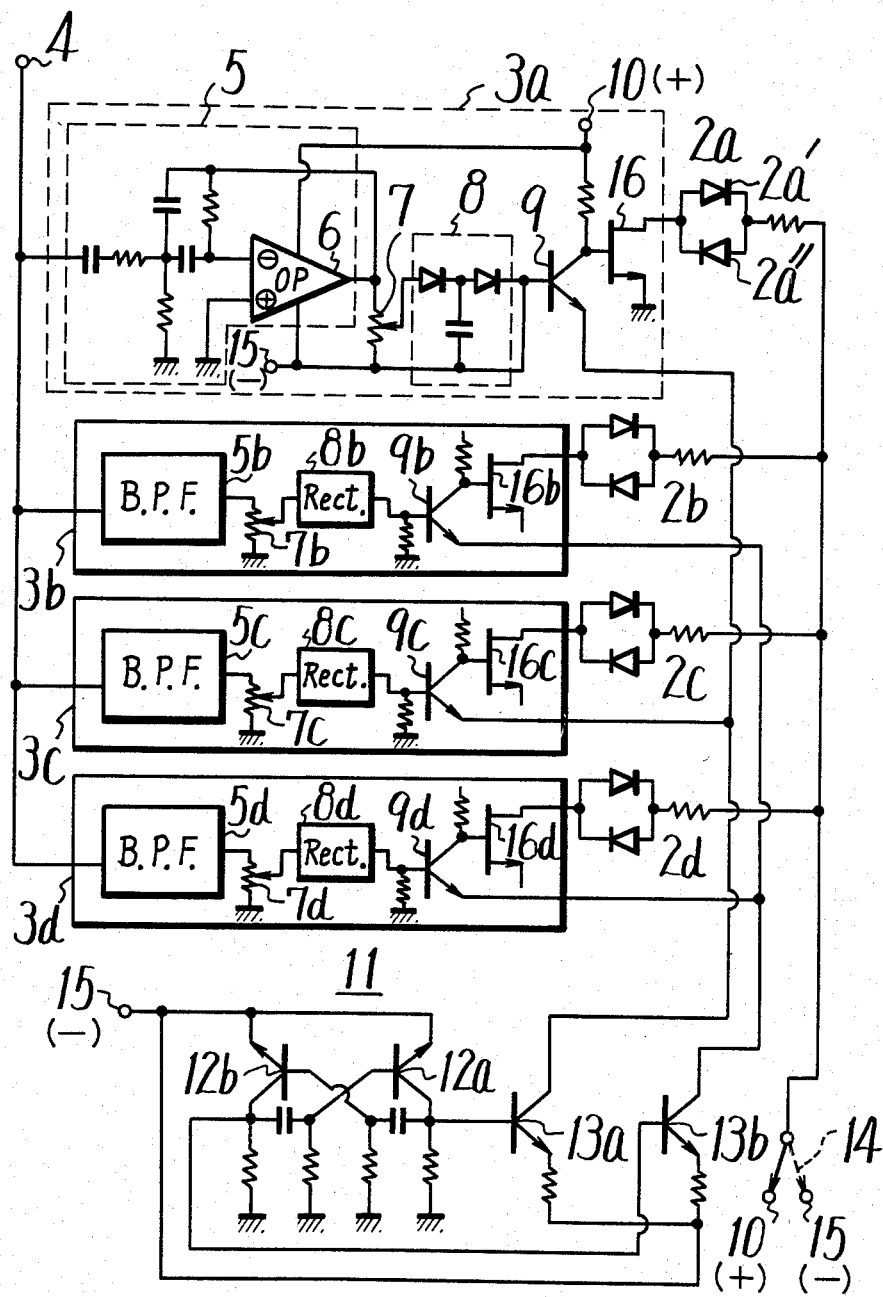
FIG. 2 illustrates a modified form of the invention and comprises an electrical schematic diagram illustrating the frequency response display for use with the graphic equalizer of the invention.

FIG. 2 illustrates another embodiment of the invention which has been modified in the output drive to the light emitting elements and a field effect transistor FET has been connected in the drive circuit. For example, a pair of light emitting diodes 2a' and 2a" which are connected in reverse polarity are connected to a changeover switch 14 that can be moved between positive and negative power terminals 10 and 15. The other side of the LEDs (light emitting diodes) 2a' and 2a" are connected to the source or drain of field effect transistor 16 which has its other terminal connected to ground. The collector of transistor 9 is connected to the gate of the field effect transistor 16. The switch 14 may be manually operated. It is to be noted that the other details of the circuit are similar to those of FIG. 1. The output of transistor 9b is connected to the gate of the field effect transistor 16b which is connected to a pair of light emitting diodes 2b which is connected through a resistor to the switch 14. The transistor 9c is connected to the gate of field effect transistor 16b which is connected to the light emitting diodes 2c which have their other sides connected through resistor to the switch 14. The transistor 9d is connected to the gate of field effect transistor 16d which is connected to the pair of light emitting diodes 2d which has its other side connected to the switch 14.

In the embodiment illustrated in FIG. 2, if the field effect transistor 16 is in the ON state and the switch 14 is connected to the positive terminal 10, then the light emitting diode 2a" will be turned on when the FET 16 conducts and the light emitting diode 2a' will remain OFF. If the switch 14 is moved to contact the negative terminal 15, the light emitting diode 2a' will be lighted when the field effect transistor 16 is turned on.

In the examples of the present invention, the output having equal levels for the frequencies fa, fb, fc and fd illustrated in FIG. 4 are respectively produced from the graphic equalizer and then fed to the input terminal 4 to the control circuits 3a, 3b, 3c and 3d, respectively. The variable resistor 7, 7b, 7c and 7d are adjusted so that the positions of the knobs 1a, 1b, 1c and 1d at which the respective light emitting elements 2a, 2b, 2c and 2d turn on and off are made to be equal.

In use, a signal from a white noise generator is recorded on a tape recorder. Then the recorded signal is reproduced by a tape recorder and fed to the graphic equalizer which has the frequency response display of the invention. The attenuation and increasing characteristics of the graphic equalizer are switched to the inverse characteristics. Under these conditions, the respective knobs 1a, 1b, 1c and 1d of the graphic equalizer are adjusted by moving them and stopped when the respective light emitting elements 2a, 2b, 2c and 2d just start to be ON and OFF. In this condition, the positions of the respective knobs 1a, 1b, 1c and 1d represent the gain of the signals Sa, Sb, Sc and Sd for the particular respective frequencies. In other words, the frequency characteristics of the recording and reproducing system of the tape recorder can be substantially visually observed. Thus, by recording and reproducing the signal under the conditions that the characteristics of the graphic equalizer are set to be normal and then are made to have the opposite characteristic to the respective knobs, signals with flat characteristics can be obtained. Also, if the switch 14 is changed over at the same time switching of the polarity of the graphic equalizer occurs, the polarity of the equalizer under operation can be observed by observing the colors of the light emitting elements 2a, 2b, 2c and 2d.

A second example of using the invention can be accomplished by applying white noise through an amplifier to a speaker and by using a microphone located at a position to pick up the sound from the speaker and by applying the output to the graphic equalizer provided with the frequency response display of the invention. Under this condition, the respective knobs 1a through 1d are adjusted such that the light emitting elements 2a through 2d start to be ON and OFF. By making this adjustment, it becomes possible to match the characteristics to the room or location where the sound is to be heard and the amplifier and other part of the system can be adjusted. Afterwards, if the characteristics of a record playback is corrected very flat conditions can be obtained.

According to the present invention, since the light emitting elements are mounted in the knobs of the graphic equalizer and can be made to turn ON and OFF in response to the level set, the characteristics can be visually observed.

Although the invention has been described with respect to preferred embodiments, it is not to be so limited as changes and modifications may be made therein which are within the full intended scope as defined by the appended claims.

We claim as our invention:

1. A frequency response display for use with a graphic equalizer comprising: an input terminal supplied with an audio signal to be displayed; two groups of control circuits, in which each control circuit consists of a band pass filter means with a center frequency and connected to the input terminal, a rectifier for receiving and rectifying the output signal from the band pass filter means, and a drive circuit means connected to the rectifier for driving a display device when the output signal of the rectifier exceeds a predetermined value; the center frequencies of said band pass filters being different from each other, and furthermore each center frequency of said band pass filters in one group of control circuits being between adjacent two center frequencies of the band pass filters in the other group of control circuits; and switching means connected to the drive circuit means in each of said control circuits for alternately operating the drive circuit means in one group of control circuits and the drive circuit means in the other group of control circuits.

2. A frequency response display according to claim 1, wherein said switching means comprises an astable multivibrator, a first switching transistor, and a second switching transistor, said first switching transistor connected to a first output of said astable multivibrator and said second switching transistor connected to a second output of said astable multivibrator.

3. A frequency response display according to claim 2, wherein said drive circuit for each of said control circuits in one of said groups of control circuits comprises a third switching transistor, an input electrode of said third switching transistor supplied with said output of its associated rectifier in each control circuit, a first output electrode of said third switching transistor connected through its associated display device to a reference potential, and a second output electrode of each third switching transistor receiving the output of said first switching transistor.

4. A frequency response display according to claim 3, wherein said drive circuit for each of control circuits in the other one of said groups of control circuits comprises a fourth switching transistor, an input electrode of said fourth switching transistor supplied with the output of its associated rectifier in each control circuit, a first output electrode of said fourth switching transistor connected through its associated display device to said reference potential, and a second output electrode of each fourth switching transistor receiving the output of said second switching transistor.

5. A frequency response display according to claim 4, including an attenuator in each of said control circuits connected between said band pass filter for said control circuit and said rectifier for said control circuit.

6. A frequency response display for use with a graphic equalizer comprising, an input terminal supplied with an audio signal to be displayed, first band pass filter means connected to said input terminal for passing therethrough a portion of the audio signal within a first frequency range, a first rectifier receiving and rectifying the output signal from said first band pass filter means, second band pass filter means connected to said input terminal for passing a portion of the audio signal within a second frequency range, a second rectifier receiving and rectifying the output signal from said second band pass filter means, a first display device, a first drive circuit means connected to said first rectifier and driving said first display device when the output of said first rectifier exceeds a pedetermined value, a second display device, a second drive circuit means connected to said second rectifier and driving said second display device when the output of said second rectifier exceeds a predetermined value, switching means connected to said first and second drive circuit means for alternately operating said first and second display devices, said switching means comprises an astable multivibrator, a first switching transistor, and a second switching transistor, said first switching transistor connected to a first output of said astable multivibrator and said second switching transistor connected to a second output of said astable multibibrator, said first drive circuit comprises a third switching transistor, an input electrode of said third switching transistor supplied with said output of said first rectifier, a first field effect transistor, a first output electrode of said third switching transistor connected to said first field effect transistor, and a second output electrode of said third switching transistor receiving the output of said first switching transistor, wherein said first display device comprises first and second light emitting diodes of different colors, and said first and second light emitting diodes connected through said first field effect transistor to said first output electrode of said third switching transistor wherein said second drive circuit comprises a fourth switching transistor, an input electrode of said fourth switching transistor supplied with the output of said second rectifier, a second field effect transistor, a first output electrode of said fourth switching transistor connected to said second field effect transistor, and a second output electrode of said fourth switching transistor receiving the output of said second switching transistor wherein said second display device comprises third and fourth light emitting diodes of different colors connected to said second field effect transistor, said third and fourth light emitting diodes connected in opposite polarity to each other, and the opposite side of said first, second, third and fourth light emitting diodes connected to a power supply.

7. A frequency response display according to claim 6 wherein the second sides of said first, second, third and fourth light emitting diodes are connected to said power supply through a polarity reversing switch.

* * * * *